(12) United States Patent
Shi et al.

(10) Patent No.: US 11,679,978 B2
(45) Date of Patent: Jun. 20, 2023

(54) METHOD FOR PREPARING MULTI-LAYER HEXAGONAL BORON NITRIDE FILM

(71) Applicant: SHANGHAI INSTITUTE OF MICROSYSTEM AND INFORMATION TECHNOLOGY, CHINESE ACADEMY OF SCIENCES, Shanghai (CN)

(72) Inventors: Zhiyuan Shi, Shanghai (CN); Tianru Wu, Shanghai (CN); Guangyuan Lu, Shanghai (CN); Xiujun Wang, Shanghai (CN); Chao Zhang, Shanghai (CN); Haomin Wang, Shanghai (CN); Xiaoming Xie, Shanghai (CN)

(73) Assignee: SHANGHAI INSTITUTE OF MICROSYSTEM AND INFORMATION TECHNOLOGY, CHINESE ACADEMY OF SCIENCES, Shanghai (CN)

( * ) Notice: Subject to any disclaimer, the term of this patent is extended or adjusted under 35 U.S.C. 154(b) by 86 days.

(21) Appl. No.: 16/759,360

(22) PCT Filed: Oct. 14, 2019

(86) PCT No.: PCT/CN2019/110961
§ 371 (c)(1),
(2) Date: Apr. 27, 2020

(87) PCT Pub. No.: WO2020/057672
PCT Pub. Date: Mar. 26, 2020

(65) Prior Publication Data
US 2021/0363010 A1    Nov. 25, 2021

(30) Foreign Application Priority Data
Sep. 20, 2018  (CN) .......................... 201811102112.2

(51) Int. Cl.
*B01J 23/755* (2006.01)
*C01B 21/064* (2006.01)
(Continued)

(52) U.S. Cl.
CPC ......... *C01B 21/0641* (2013.01); *B01J 23/745* (2013.01); *B01J 23/755* (2013.01);
(Continued)

(58) Field of Classification Search
CPC . C01P 2002/72; C01P 2004/03; B01J 23/755; B01J 23/745
See application file for complete search history.

(56) References Cited

U.S. PATENT DOCUMENTS

| 2015/0086460 A1* | 3/2015 | Kim ...................... C23C 18/143 427/532 |
| 2017/0275742 A1* | 9/2017 | Ganor ...................... B22F 3/16 |

FOREIGN PATENT DOCUMENTS

| CN | 1397491 A | 2/2003 |
| CN | 103774113 A | 5/2014 |

(Continued)

OTHER PUBLICATIONS

Shi, Zhiyuan et al."Influence of oxygen on the synthesis of large area hexagonal boron nitride on Fe2B substrate"Materials Letters, vol. 247,Mar. 21, 2019(Mar. 21, 2019), ISSN:0167-577X, pp. 52-55.
(Continued)

*Primary Examiner* — Cynthia H Kelly
*Assistant Examiner* — Monique M Wills (57) ABSTRACT

The present disclosure provides a method for preparing a multi-layer hexagonal boron nitride film, including: preparing a substrate; preparing a boron-containing solid catalyst, and disposing the boron-containing solid catalyst on the substrate; annealing the boron-containing solid catalyst to
(Continued)

melt the boron-containing solid catalyst; feeding a nitrogen-containing gas and a protecting gas to an atmosphere in which the melted boron-containing solid catalyst resides, the nitrogen-containing gas reacts with the boron-containing solid catalyst to form the multi-layer hexagonal boron nitride film on a surface of the substrate. The method for preparing a multi-layer hexagonal boron nitride film can prepare a hexagonal boron nitride film having a lateral size in the order of inches and a thickness from several nanometers to several hundred nanometers on the surface of the substrate, providing a favorable basis for the application of hexagonal boron nitride in the field of two-dimensional material devices.

13 Claims, 6 Drawing Sheets

(51) Int. Cl.
    *B01J 23/745*     (2006.01)
    *C23C 16/34*     (2006.01)

(52) U.S. Cl.
    CPC ........ *C23C 16/342* (2013.01); *C01P 2002/72* (2013.01); *C01P 2002/76* (2013.01); *C01P 2002/82* (2013.01); *C01P 2004/02* (2013.01); *C01P 2004/03* (2013.01); *C01P 2004/04* (2013.01)

(56) References Cited

FOREIGN PATENT DOCUMENTS

| | | |
|---|---|---|
| CN | 104860273 A | 8/2015 |
| CN | 107973280 A | 5/2018 |
| JP | 5547379 A | 4/1980 |
| WO | WO2018128193 A1 | 7/2018 |

OTHER PUBLICATIONS

Shi, Zhiyuan et al."Controlled synthesis of uniform multilayer hexagonal boron nitride films on Fe2B alloy"RSC Advances, vol. No.18, Apr. 1, 2019(Apr. 1, 2019), ISSN:2046-2069, pp. 10155-10158.

* cited by examiner

FIG. 13

METHOD FOR PREPARING MULTI-LAYER HEXAGONAL BORON NITRIDE FILM

CROSS REFERENCES TO RELATED APPLICATIONS

This is a Sect. 371 National Stage application of a PCT International Application No. PCT/CN2019/110961, filed on Oct. 14, 2019, which claims priority of a Chinese Patent Applications No. 201811102112.2, filed on Sep. 20, 2018, the content of which is hereby incorporated by reference in its entirety for all purposes.

TECHNICAL FIELD

The present disclosure relates to the technical field of two-dimensional material preparation, and in particular, to a method for preparing a multi-layer hexagonal boron nitride film.

BACKGROUND

Hexagonal boron nitride layered material is a typical two-dimensional insulating or semiconductor material, which has a high band gap (5.97 eV), excellent thermal and chemical stability, and ultra-high thermal conductivity. At the same time, hexagonal boron nitride and graphene have similar lattice structure and electronic structure. Hexagonal boron nitride has low lattice mismatching (about 1.6%), the atomically flat surface can effectively keep the intrinsic electronic properties of graphene. These advantages make hexagonal boron nitride have excellent potential in the field of integrated electronics and photonics as a high-quality dielectric layer and protective layer.

Like other two-dimensional materials, high-quality multi-layer hexagonal boron nitride films can be prepared by a mechanical exfoliation method. However, the mechanical exfoliation method has a high cost, low efficiency, small size, and difficulty in mass production, which greatly limits the application in devices. Therefore, low-cost and environmental-friendly preparation of large-area multi-layer boron nitride films has become a major focus of mainstream research in recent years.

The chemical vapor deposition method is the main method for mass preparation of multi-layer hexagonal boron nitride films. At present, chemical vapor deposition method has been applied to prepare multilayer hexagonal boron nitride films on transition metals, such as copper (Cu), nickel (Ni), iron (Fe), platinum (Pt), copper-nickel alloy (Cu—Ni), iron-nickel alloy (Fe—Ni), nickel-chromium alloy (Ni—Cr). However, the quality of the obtained multi-layer hexagonal boron nitride films is poor, and the thickness of the atomic layer is generally less than ten nanometers, which cannot satisfy the application requirement in the device. $BH_3NH_3$, $(HBNH)_3$, $(HBNCl)_3$, or $(ClBNH)_3$ usually serves as the source materials for the preparation of multi-layer hexagonal boron nitride. These source materials can easily form a polymer depositing on the surface of the substrate, which affects the quality of the hexagonal boron nitride. Meanwhile, some of the source material has toxicity, therefore is not eco-friendly, and is difficult for green production. Therefore, it is a problem in current scientific research for the environmentally-friendly preparation of large-area and high-quality multi-layer boron nitride films.

SUMMARY

The present disclosure provides a method for preparing a multi-layer hexagonal boron nitride film, to solve the problems existing in the traditional methods for preparing multi-layer hexagonal boron nitride films. In traditional methods, the cost is high, the efficiency is low, and it is difficult for mass production. The multi-layer hexagonal boron nitride film prepared by traditional methods has poor quality and limited thickness, therefore cannot satisfy the application requirement in the device field. Moreover, in traditional methods, the source material for forming hexagonal boron nitride affects the quality of the hexagonal boron nitride film. Some of the source material has toxicity and will pollute the environment.

The present disclosure provides a method for preparing a multi-layer hexagonal boron nitride film, including:

in a first operation, preparing a substrate, which includes an insulating substrate or a semiconductor substrate;

in a second operation, preparing a boron-containing solid catalyst, and disposing the boron-containing solid catalyst on the substrate;

in a third operation, annealing the boron-containing solid catalyst to melt the boron-containing solid catalyst;

in a fourth operation, feeding a nitrogen-containing gas and a protecting gas to an atmosphere in which the melted boron-containing solid catalyst resides, the nitrogen-containing gas reacts with the boron-containing solid catalyst to form the multi-layer hexagonal boron nitride film on a surface of the substrate.

Optionally, the substrate provided in the first operation includes a silicon nitride substrate, a silicon oxide substrate, an aluminum nitride substrate, a magnesium oxide substrate, or an aluminum oxide substrate.

Optionally, the boron-containing solid catalyst provided in the second operation includes at least one of a nickel-boron alloy catalyst, an iron-boron alloy catalyst, a platinum-boron alloy catalyst, and a cobalt-boron alloy catalyst, a chromium-boron alloy catalyst, an iron-nickel-boron alloy catalyst, an iron-boron-silicon alloy catalyst and a nickel-boron-silicon alloy catalyst.

Optionally, in the third operation, the substrate and the boron-containing solid catalyst are packed in a closed insulation crucible or a closed semiconductor crucible, and then placed in a chemical vapor deposition chamber. A protecting gas is introduced into the chemical vapor deposition chamber. The boron-containing solid catalyst is annealed under a protecting atmosphere and at a normal pressure condition or low pressure condition.

Optionally, the annealing temperature is 800-1500° C., and the annealing time is 0.5-2 hours.

Optionally, in the third operation, before the annealing treatment of the boron-containing solid catalyst, the method further includes: feeding a protecting gas into the chemical vapor deposition chamber, raising the temperature in the chemical vapor deposition chamber to the desired annealing temperature at a heating rate of 2-10° C./min under a protecting atmosphere and at a normal pressure condition or low pressure condition.

Optionally, the protecting gas includes argon and hydrogen, and the volume ratio of the argon and hydrogen is 1:1 to 30:1; the pressure of the low pressure condition is 50-5000 Pa.

Optionally, in the fourth operation, the nitrogen-containing gas includes nitrogen or ammonia, and the protecting gas includes argon and hydrogen; a volume ratio of the nitrogen-containing gas to the argon and the hydrogen is 30:1:1 to 1:30:30.

Optionally, in the fourth operation, the nitrogen-containing gas reacts with the boron-containing solid catalyst under normal pressure condition or low pressure condition, and the reaction time is 0.5-8 hours.

Optionally, after the fourth operation, cooling the substrate with the multi-layer hexagonal boron nitride film formed on the surface to room temperature.

Optionally, cooling the substrate with the multi-layer hexagonal boron nitride film formed on the surface to room temperature under a protecting atmosphere of nitrogen and ammonia and at a normal pressure condition, and the cooling rate is 0.25-10° C./min.

As described above, the method for preparing a multi-layer hexagonal boron nitride film of the present disclosure has the following beneficial effects:

The method for preparing a multi-layer hexagonal boron nitride film can prepare a hexagonal boron nitride film having a lateral size in the order of inches and a thickness from several nanometers to several hundred nanometers on the surface of the substrate. The method for preparing a multi-layer hexagonal boron nitride film has simple preparation conditions and low costs, is environmentally friendly, and has a wide window for growth parameters and good repeatability, thereby providing a favorable basis for the application of hexagonal boron nitride in the field of two-dimensional material devices.

DESCRIPTION OF REFERENCE NUMERALS

1 Chemical vapor deposition chamber
11 Gas inlet
12 Gas outlet
2 Heating system
3 Substrate
4 Boron-containing catalyst
5 Mechanical pump

DETAILED DESCRIPTION OF THE PREFERRED EMBODIMENTS

The embodiments of the present disclosure will be described below through exemplary embodiments. Those skilled in the art can easily understand other advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure.

Referring to FIGS. 1-13. It needs to be stated that the drawings provided in the following embodiments are just used for schematically describing the basic concept of the present disclosure, thus only illustrating components only related to the present disclosure and are not drawn according to the numbers, shapes and sizes of components during actual implementation, the configuration, number and scale of each component during the actual implementation thereof may be freely changed, and the component layout configuration thereof may be more complex.

Figure 1:
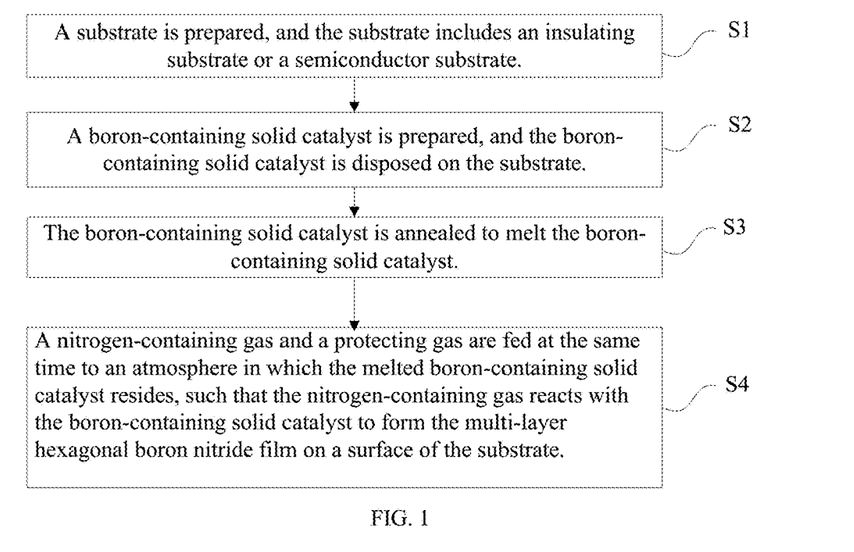
FIG. 1 shows a flow chart of a method for preparing a multi-layer hexagonal boron nitride film provided by the present disclosure.

Referring to FIG. 1, the present disclosure provides a method for preparing a multi-layer hexagonal boron nitride film, including:

in a first operation, preparing a substrate, which includes an insulating substrate or a semiconductor substrate;

in a second operation, providing a boron-containing solid catalyst, and disposing the boron-containing solid catalyst on the substrate;

in a third operation, annealing the boron-containing solid catalyst to melt the boron-containing solid catalyst;

in a fourth operation, feeding a nitrogen-containing gas and a protecting gas to the atmosphere in which the melted boron-containing solid catalyst is located, the nitrogen-containing gas reacts with the boron-containing solid catalyst to form the multi-layer hexagonal boron nitride film on the substrate.

In the first operation, referring to S1 in FIG. 1, a substrate is prepared. The substrate includes an insulating substrate or a semiconductor substrate.

As an example, the substrate includes a silicon nitride ($Si_3N_4$) substrate, a silicon oxide ($SiO_2$) substrate, an aluminum nitride (AlN) substrate, a magnesium oxide (MgO) substrate, or an aluminum oxide ($Al_2O_3$) substrate.

In the second operation, referring to S2 in FIG. 1, a boron-containing solid catalyst is prepared, and the boron-containing solid catalyst is disposed on the substrate.

As an example, the boron-containing solid catalyst includes at least one of a nickel-boron (Ni—B) alloy catalyst, an iron-boron (Fe—B) alloy catalyst, a platinum-boron (Pt—B) alloy catalyst, and a cobalt-boron (Co—B) alloy catalyst, a chromium-boron (Cr—B) alloy catalyst, an iron-nickel-boron (Fe—Ni—B) alloy catalyst, an iron-boron-silicon (Fe—B—Si) alloy catalyst and a nickel-boron-silicon (Ni—B—Si) alloy catalyst.

Figure 2:
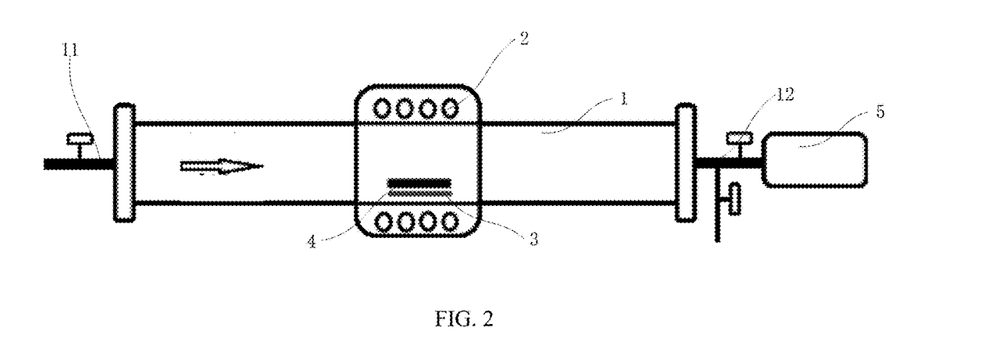
FIG. 2 shows a schematic diagram of a device for preparing a multi-layer hexagonal boron nitride film using Fe—B alloy as a boron-containing solid catalyst, nitrogen as a gaseous source, and an $Al_2O_3$ substrate.

In the third operation, referring to S3 in FIG. 1 and FIG. 2, the boron-containing solid catalyst is annealed to melt the boron-containing solid catalyst.

As an example, the substrate 3 and the boron-containing solid catalyst 4 are placed in a closed insulation crucible or a closed semiconductor crucible, and then placed in a chemical vapor deposition chamber 1 as shown in FIG. 1. A protecting gas is introduced into the chemical vapor deposition chamber 1 through a gas inlet 11 (the arrow in FIG. 2 indicates the flow direction of the protecting gas). The boron-containing solid catalyst is annealed under a protecting atmosphere and at a normal pressure condition or at a low pressure condition. Specifically, the pressure in the chemical vapor deposition chamber 1 may be controlled through the mechanical pump 5 at the gas outlet 12 by extracting the protecting gas in the chemical vapor deposition chamber 1. As an example, the substrate 3 and the boron-containing solid catalyst 4 are heated using a heating system 2 for the annealing treatment of the boron-containing solid catalyst 4. The annealing temperature may be 800-1500° C., and the annealing time may be 0.5-2 hours.

As an example, before the annealing treatment of the boron-containing solid catalyst 4, the method further includes: feeding a protecting gas into the chemical vapor deposition chamber 1, raising the temperature in the chemical vapor deposition chamber 1 to the desired annealing temperature at a heating rate of 2-10° C./min under a protecting atmosphere and at a normal pressure condition or low pressure condition.

As an example, the protecting gas includes argon and hydrogen, and the volume ratio of the argon and hydrogen is 1:1 to 30:1; the pressure of the low pressure condition is 50-5000 Pa.

In the fourth operation, referring to S4 in FIG. 1 and FIG. 2, a nitrogen-containing gas and a protecting gas are fed at the same time to an atmosphere in which the melted boron-containing solid catalyst resides, such that the nitrogen-containing gas reacts with the boron-containing solid catalyst to form the multi-layer hexagonal boron nitride film on a surface of the substrate.

As an example, a nitrogen-containing gas and a protecting gas are introduced into the chemical vapor deposition chamber 1 at the same time as shown in FIG. 2.

As an example, the nitrogen-containing gas includes nitrogen or ammonia, and the protecting gas includes argon and hydrogen. The volume ratio of the nitrogen-containing gas to the argon and the hydrogen is 30:1:1 to 1:30:30.

As an example, the nitrogen-containing gas reacts with the boron-containing solid catalyst under normal pressure condition or low pressure condition, and the reaction time is 0.5-8 hours. The pressure of the low pressure condition is 50-5000 Pa.

As an example, after the fourth operation, cooling the substrate with the multi-layer hexagonal boron nitride film formed on the surface to room temperature.

As an example, cooling the substrate with the multi-layer hexagonal boron nitride film formed on the surface to room temperature under a protecting atmosphere of nitrogen and ammonia and at a normal pressure condition. The cooling rate is 0.25-10° C./min.

Through the above preparation method, a hexagonal boron nitride film with several to several thousand layers can be prepared. The lateral size of the obtained multi-layer hexagonal boron nitride film can reach an inch level.

For better comparison and analysis, the following describes the preparation method of the multi-layer hexagonal boron nitride film of the present disclosure in detail with specific embodiments. In the embodiments listed in the present disclosure, multi-layer hexagonal boron nitride films are prepared by chemical vapor deposition method under a normal-pressure atmosphere. FIG. 2 is a schematic diagram of a typical device. Optionally, a low-pressure (50-5000 Pa) atmosphere may be adopted. Since the chemical vapor deposition process and the device used are well known to those skilled in the art, it will not be described again here.

Embodiment 1

In this embodiment, Fe—B alloy is selected as the boron-containing solid catalyst, polished $Al_2O_3$ substrate is selected as the substrate, and nitrogen is selected as the gaseous nitrogen source.

The Fe—B alloy is placed above the $Al_2O_3$ substrate and hermetically placed in an insulation crucible or a semiconductor crucible. The device is placed in a chemical vapor deposition chamber, and then is heated, annealed at high temperature, grown and cooled under normal-pressure.

In the heating stage, the temperature is raised to 1250° C. under a normal-pressure atmosphere, and the heating rate is 10° C./min. In this process, argon and hydrogen gas are introduced, and the volume ratio is $Ar:H_2=6:1$. In the high-temperature annealing stage, the annealing temperature is kept at 1250° C. under normal-pressure atmosphere, and the annealing time is 60 min. In this process, argon and hydrogen gas are introduced, and the volume ratio is $Ar:H_2=6:1$. In the growth stage, the growth temperature is 1250° C. under normal pressure, and the growth time is 240 min. In this process, nitrogen, argon and hydrogen are introduced, and the flow rate ratio is $N_2:Ar:H_2=6:1:1$. In the cooling stage, the temperature dropped from 1250° C. to room temperature under a normal-pressure atmosphere, and the cooling rate is 10° C./min. In this process, argon and hydrogen are introduced, and the flow rate ratio is $Ar:H_2=6:1$. After the chamber is cooled to room temperature, the $Al_2O_3$ substrate is taken out, and a multi-layer hexagonal boron nitride film is obtained on the surface of the substrate.

Figure 3:
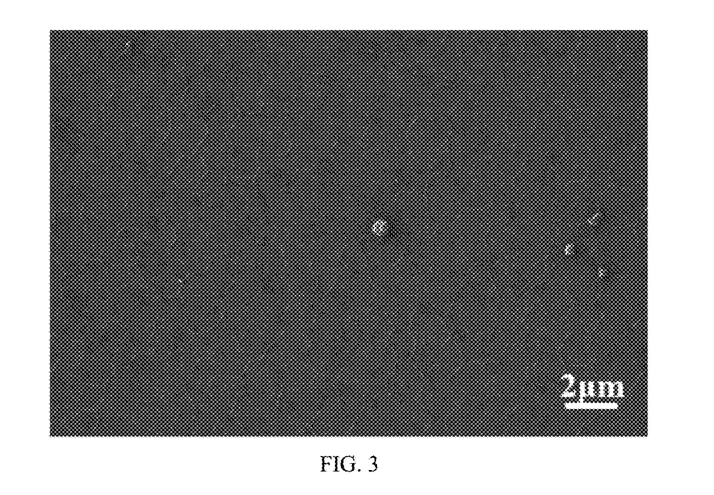
FIG. 3 shows an SEM image of a multi-layer hexagonal boron nitride film prepared by the method for preparing a multi-layer hexagonal boron nitride film according to Embodiment 1 of the present disclosure.
Figure 4:
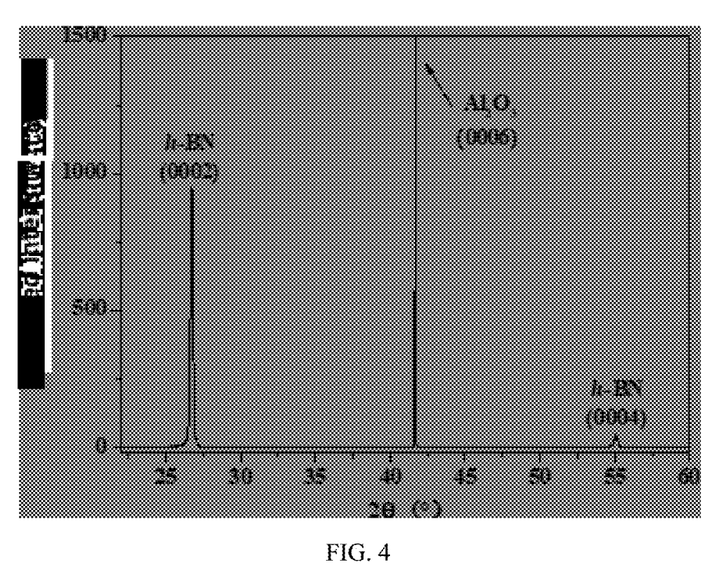
FIG. 4 shows an XRD spectrum of a multi-layer hexagonal boron nitride film prepared by the method for preparing a multi-layer hexagonal boron nitride film according to Embodiment 1 of the present disclosure.
Figure 5:
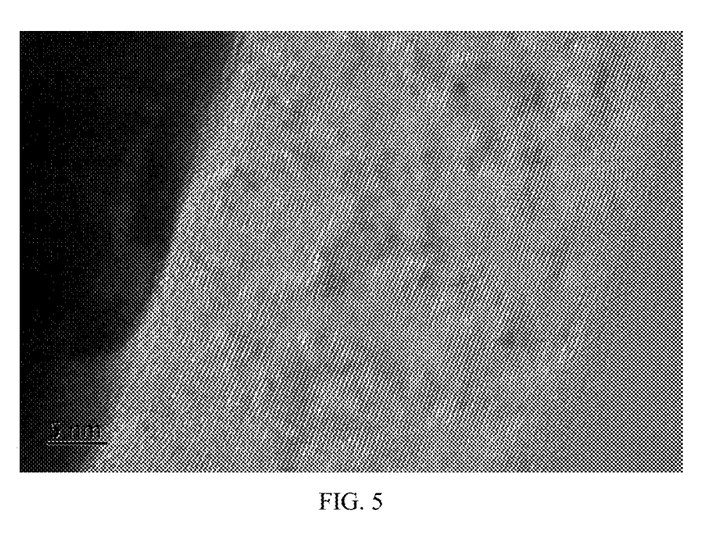
FIG. 5 shows a TEM image of a multi-layer hexagonal boron nitride film prepared by the method for preparing a multi-layer hexagonal boron nitride film according to Embodiment 1 of the present disclosure.
Figure 6:
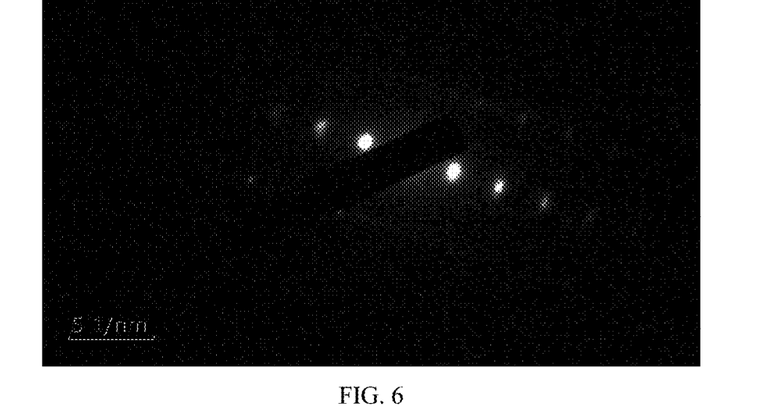
FIG. 6 shows a nano-beam electron diffraction image of a multi-layer hexagonal boron nitride film prepared by the method for preparing a multi-layer hexagonal boron nitride film according to Embodiment 1 of the present disclosure.

In this embodiment, nitrogen gas is introduced into the chamber with a protecting atmosphere. In the high-temperature annealing stage, the Fe—B alloy is fully melted, and the solubility of nitrogen element is greatly improved. In the growth stage, nitrogen and boron are combined under the catalytic action of iron to form a hexagonal boron nitride nucleating core. As the growth time increases, the hexagonal boron nitride core grows and merges on the alloy surface to form a film. The binding force between the hexagonal boron nitride and metal is weak, thus, the hexagonal boron nitride is easy to desorb from the alloy, and deposited on the surface of $Al_2O_3$ substrate under the action of gravity. As shown in FIG. 3, it can be seen from the SEM image that under the above-mentioned growth conditions, a large-area hexagonal boron nitride film can be obtained on the $Al_2O_3$ surface. As shown in FIG. 4, the XRD spectrum shows that the diffracted intensity has obvious characteristic peaks at 26.8°. It can be seen from the standard diffraction card that the peak is a characteristic diffraction peak of hexagonal boron nitride (0002), which proves that the grown film is a multi-layer hexagonal boron nitride. The $Al_2O_3$ substrate after growth is cut by a focused ion beam to obtain a cross-sectional structure. The cross-sectional structure is observed with TEM to determine the thickness, interlayer stacking and crystallinity of the hexagonal boron nitride. As shown in FIG. 5, the interlayer distribution of the layered hexagonal boron nitride can be clearly observed, and the layer thickness is about 40 nanometers. FIG. 6 shows the nano-beam convergent diffraction of the cross-section sample. It can be seen that the crystal quality of the hexagonal boron nitride is very high.

Embodiment 2

The difference between the present embodiment and the embodiment 1 is that the substrate (i.e. $Al_2O_3$ polished substrate) in embodiment 1 is replaced with a $SiO_2$ polished substrate, and the remaining process parameters are the same as those in embodiment 1.

Figure 7:
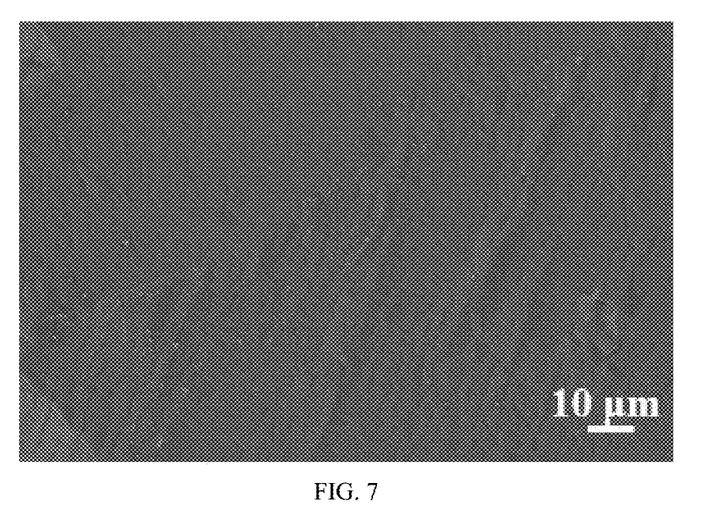
FIG. 7 shows an SEM image of a multi-layer hexagonal boron nitride film prepared by the method for preparing a multi-layer hexagonal boron nitride film according to Embodiment 2 of the present disclosure.
Figure 8:
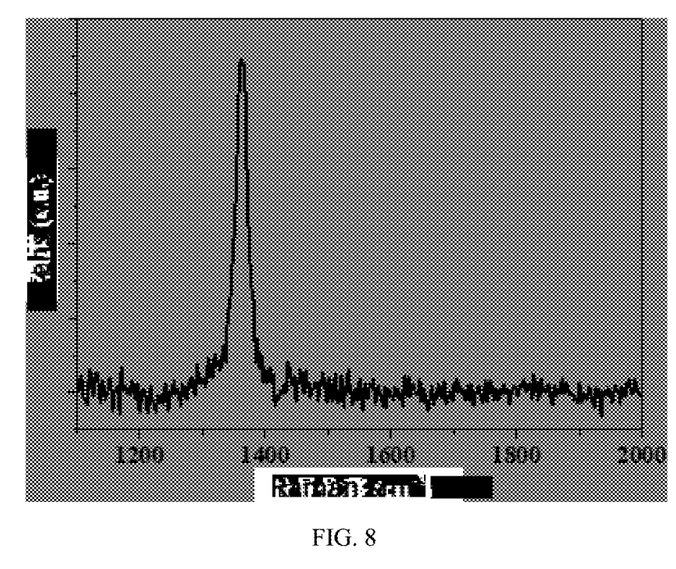
FIG. 8 shows a Raman spectrum of a multi-layer hexagonal boron nitride film prepared by the method for preparing a multi-layer hexagonal boron nitride film according to Embodiment 2 of the present disclosure.

In this embodiment, by observing the hexagonal boron nitride film on the $SiO_2$ substrate by SEM, as shown in FIG. 7, compared with embodiment 1, after selecting the $SiO_2$ substrate, the surface wrinkle density of the hexagonal boron nitride film is significantly reduced. Compared with $Al_2O_3$ substrate, the thermal expansion coefficient of $SiO_2$ substrate is closer to that of hexagonal boron nitride, so the wrinkle density of the hexagonal boron nitride film decreases after cooling. As shown in FIG. 8, the Raman characteristic peak of the hexagonal boron nitride is 1366 $cm^{-1}$, which indicates that the obtained hexagonal boron nitride film is multi-layered.

Embodiment 3

The difference between the present embodiment and the embodiment 1 is that the gaseous nitrogen source (i.e. Nitrogen) is replaced with ammonia, and the flow rate ratio during the growth stage is $NH_3:Ar:H_2=0.5:15:1$, and other process parameters are the same as those in Embodiment 1.

Figure 9:
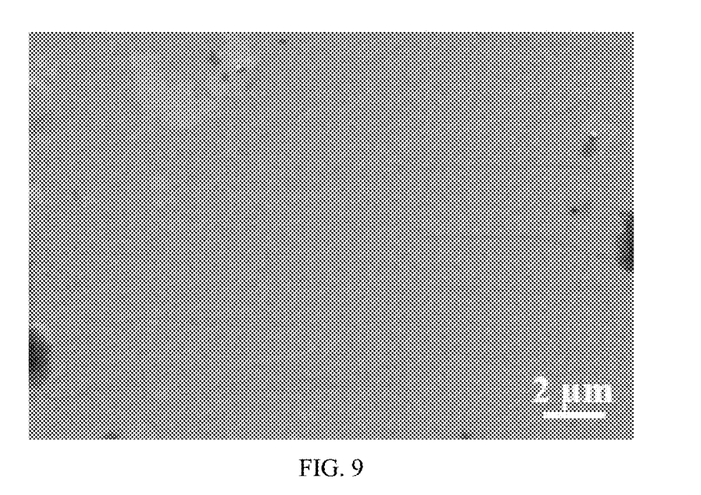
FIG. 9 shows an SEM image of a multi-layer hexagonal boron nitride film prepared by the method for preparing a multi-layer hexagonal boron nitride film according to Embodiment 3 of the present disclosure.

In this embodiment, by observing the hexagonal boron nitride film on the $Al_2O_3$ substrate by SEM, as shown in FIG. 9, compared with embodiment 1, the hexagonal boron nitride forms a large-area continuous film on a surface of the $Al_2O_3$ substrate, but the film layer is thin and no obvious wrinkle is observed. After the gaseous source is replaced with ammonia, under the growth temperature of 1250° C., a large amount of ammonia is cracked to hydrogen and nitrogen. The partial pressure of hydrogen increases and the partial pressure of nitrogen decreases in the reaction chamber, so the continuous hexagonal boron nitride film with fewer layers is obtained under the same growth time condition.

Embodiment 4

The difference between the present embodiment and the embodiment 1 is that the growth time is reduced to 60 min. The remaining process parameters are the same as those in embodiment 1.

Figure 10:
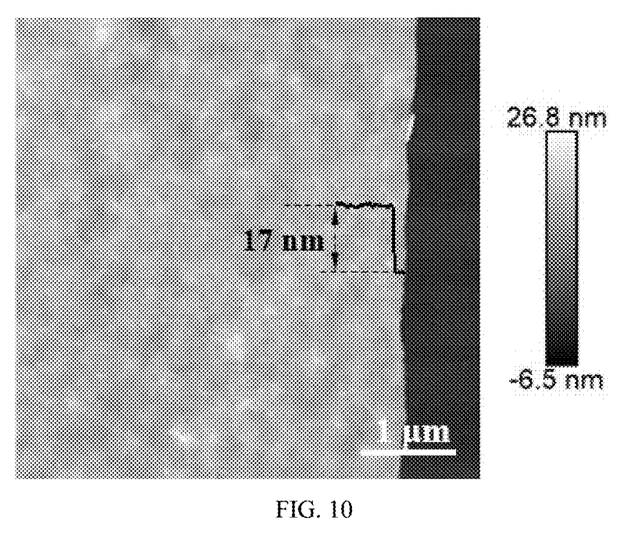
FIG. 10 shows an AFM image of a multi-layer hexagonal boron nitride film prepared by the method for preparing a multi-layer hexagonal boron nitride film according to Embodiment 4 of the present disclosure.

In this embodiment, the thickness of the hexagonal boron nitride film on the $Al_2O_3$ substrate is measured by the tapping mode of AFM. As shown in FIG. 10, when the growth time is reduced to 60 min, the typical thickness of the hexagonal boron nitride film is about 17 nanometers, significantly lower than that of embodiment 1. As the growth time is shortened, the amount of nitrogen element diffused to the interface between the liquid alloy catalyst and the substrate is reduced, so the thickness of the hexagonal boron nitride film formed by the reaction is reduced.

Embodiment 5

The difference between the present embodiment and the embodiment 1 is that the boron-containing solid catalyst is replaced with a Ni—B alloy. The remaining process parameters are the same as those in embodiment 1.

Figure 11:
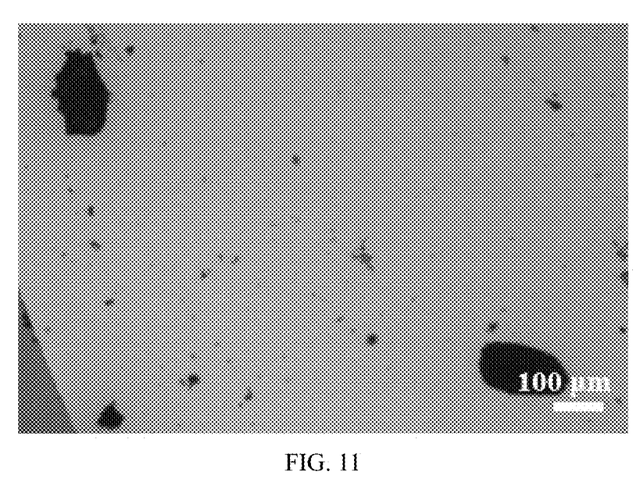
FIG. 11 shows an OM image of a multi-layer hexagonal boron nitride film prepared by the method for preparing a multi-layer hexagonal boron nitride film according to Embodiment 5 of the present disclosure.
Figure 12:
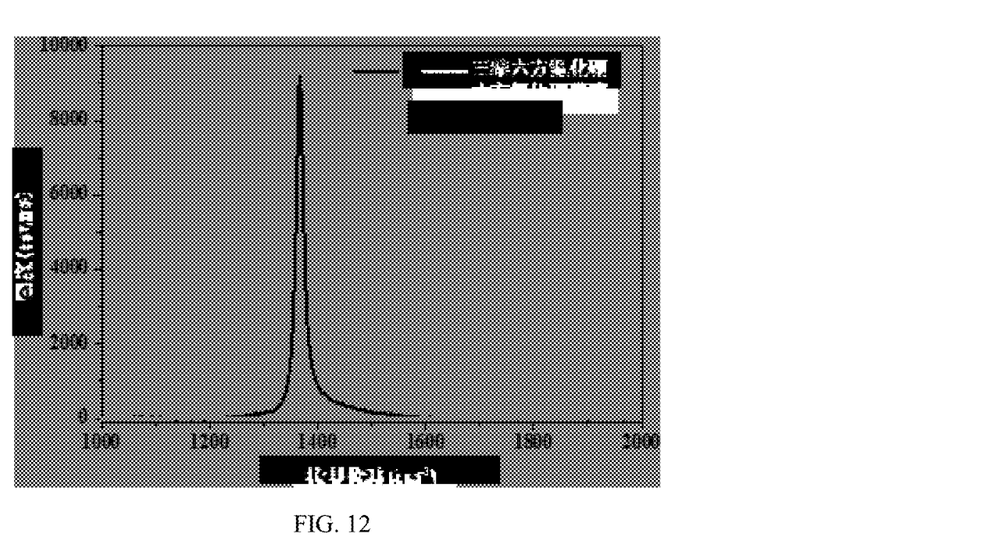
FIG. 12 shows a Raman spectrum of a multi-layer hexagonal boron nitride film prepared by the method for preparing a multi-layer hexagonal boron nitride film according to Embodiment 5 of the present disclosure.

In this embodiment, compared with embodiment 1, Ni—B alloy is used as a boron-containing solid catalyst, Ni—B alloy has a melting point more than 200° C. lower than Fe-b alloy. Therefore, the boron-containing solid catalyst can fully melt and react with N2 at 1250° C. Observing the hexagonal boron nitride film on the $Al_2O_3$ substrate by SEM, as shown in FIG. 11, the hexagonal boron nitride thin film (large-area white area) has a high coverage on the $Al_2O_3$ substrate. At the same time, three-dimensional hexagonal boron nitride (island-shaped black areas) begins to form on the surface of the $Al_2O_3$ substrate and is distributed randomly. As shown in FIG. 12, Raman spectrum the continuous hexagonal boron nitride film and the three-dimensional hexagonal boron nitride on the $Al_2O_3$ substrate are obtained, it can be seen that the signal strength of the three-dimensional hexagonal boron nitride is an order of magnitude higher than that of the continuous film, but Raman characteristic peaks both are at 1366 $cm^{-1}$, which also proves that the obtained material is multi-layered hexagonal boron nitride.

Contrast Embodiment

The difference between the present embodiment and the embodiment 1 is that the relative position of the Fe—B alloy and the $Al_2O_3$ substrate is exchanged. That is, the $Al_2O_3$ substrate is placed above the Fe—B alloy. The remaining process parameters are the same as those in embodiment 1.

Figure 13:
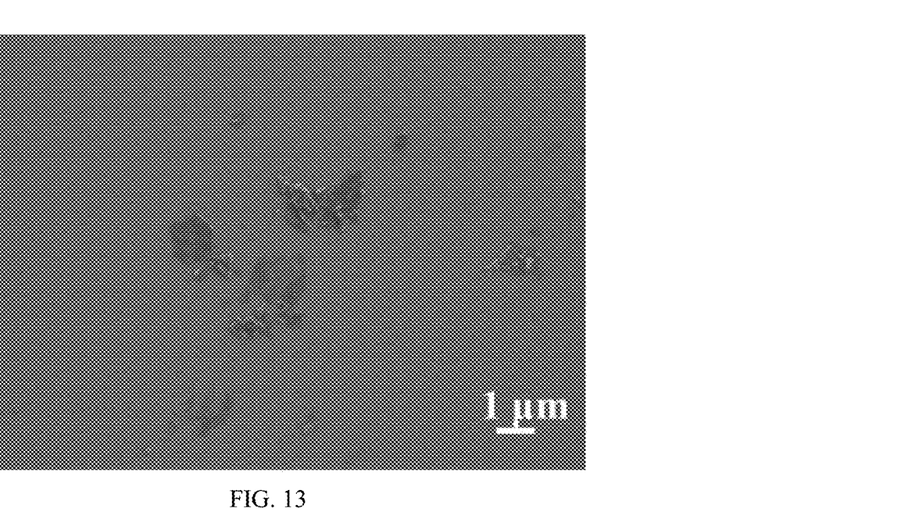
FIG. 13 shows an SEM image of a multi-layer hexagonal boron nitride film prepared by the method for preparing a multi-layer hexagonal boron nitride film according to the contrast embodiment of the present disclosure.

In this embodiment, the $Al_2O_3$ substrate is placed above the Fe—B alloy, at a high temperature, only part of the Fe—B phase in the liquid Fe—B alloy is attached to the surface of the substrate due to vapor pressure and the capillary interaction between liquid and solid. With the introduction of the nitrogen-containing source, hexagonal boron nitride is gradually formed on the surface of the substrate. Observing the hexagonal boron nitride film on the $Al_2O_3$ substrate by scanning electron microscope (SEM), as shown in FIG. 13, compared with embodiment 1, the hexagonal boron nitride film on the $Al_2O_3$ substrate is randomly distributed, with a low coverage and fragmentation. Since a very small amount of boron and iron diffuse to the $Al_2O_3$ substrate, the prepared hexagonal boron nitride is randomly distributed.

In summary, the present disclosure provides a method for preparing a multi-layer hexagonal boron nitride film, including: preparing a substrate, which includes an insulating substrate or a semiconductor substrate; preparing a boron-containing solid catalyst, and disposing the boron-containing solid catalyst on the substrate; annealing the boron-containing solid catalyst to melt the boron-containing solid catalyst; feeding a nitrogen-containing gas and a protecting gas at the same time to an atmosphere in which the melted boron-containing solid catalyst resides, such that the nitrogen-containing gas reacts with the boron-containing solid catalyst to form the multi-layer hexagonal boron nitride film on a surface of the substrate. The method for preparing a multi-layer hexagonal boron nitride film can prepare a hexagonal boron nitride film having a lateral size in the order of inches and a thickness from several nanometers to several hundred nanometers on the surface of the substrate. The method for preparing a multi-layer hexagonal boron nitride film has simple preparation conditions and low costs, is environmentally friendly, and has a wide window for growth parameters and good repeatability, thereby providing a favorable basis for the application of hexagonal boron nitride in the field of two-dimensional material devices.

The above-mentioned embodiments are just used for exemplarily describing the principle and effects of the present disclosure instead of limiting the present disclosure. Modifications or variations of the above-described embodiments may be made by those skilled in the art without departing from the spirit and scope of the disclosure. Therefore, all equivalent modifications or changes made by those who have common knowledge in the art without departing from the spirit and technical concept disclosed by the present disclosure shall be still covered by the claims of the present disclosure.

The invention claimed is:

1. A method for preparing a multi-layer hexagonal boron nitride film, comprising:
    in a first operation, preparing a substrate, the substrate includes an insulating substrate or a semiconductor substrate;
    in a second operation, preparing a boron-containing solid catalyst, and disposing the boron-containing solid catalyst on the substrate;
    in a third operation, annealing the boron-containing solid catalyst to melt the boron-containing solid catalyst;
    in a fourth operation, feeding a nitrogen-containing gas and a protecting gas to an atmosphere in which the melted boron-containing solid catalyst resides, the nitrogen-containing gas reacts with the boron-containing solid catalyst to form the multi-layer hexagonal boron nitride film on a surface of the substrate, wherein
    in the third operation, the boron-containing solid catalyst is annealed under a protecting atmosphere and at a normal pressure condition or low pressure condition.

2. The method for preparing a multi-layer hexagonal boron nitride film according to claim 1, wherein the substrate in the first operation comprises a silicon nitride substrate, a silicon oxide substrate, an aluminum nitride substrate, a magnesium oxide substrate, or an aluminum oxide substrate.

3. The method for preparing a multi-layer hexagonal boron nitride film according to claim 1, wherein the boron-containing solid catalyst in the second operation comprises at least one of a nickel-boron alloy catalyst, an iron-boron alloy catalyst, a platinum-boron alloy catalyst, and a cobalt-boron alloy catalyst, a chromium-boron alloy catalyst, an iron-nickel-boron alloy catalyst, an iron-boron-silicon alloy catalyst and a nickel-boron-silicon alloy catalyst.

4. The method for preparing a multi-layer hexagonal boron nitride film according to claim 1, wherein in the third operation, placing the substrate and the boron-containing solid catalyst in a closed insulation crucible or a closed semiconductor crucible, placing the crucible in a chemical vapor deposition chamber, and feeding a protecting gas into the chemical vapor deposition chamber.

5. The method for preparing a multi-layer hexagonal boron nitride film according to claim 4, wherein an annealing temperature is 800-1500° C., and an annealing time is 0.5-2 hours.

6. The method for preparing a multi-layer hexagonal boron nitride film according to claim 4, wherein in the third operation, before the annealing treatment of the boron-containing solid catalyst, the method further comprises: feeding the protecting gas into the chemical vapor deposition chamber, raising a temperature in the chemical vapor deposition chamber to a desired annealing temperature at a heating rate of 2-10° C./min under a protecting atmosphere and at a normal pressure condition or low pressure condition.

7. The method for preparing a multi-layer hexagonal boron nitride film according to claim 2, wherein the protecting gas comprises argon and hydrogen, a volume ratio of the argon to hydrogen is 1:1 to 30:1, and a pressure of the low pressure condition is 50-5000 Pa.

8. The method for preparing a multi-layer hexagonal boron nitride film according to claim 1, wherein in the fourth operation, the nitrogen-containing gas comprises nitrogen or ammonia, the protecting gas comprises argon and hydrogen, and a volume ratio of the nitrogen-containing gas to the argon and the hydrogen is 30:1:1 to 1:30:30.

9. The method for preparing a multi-layer hexagonal boron nitride film according to claim 1, wherein in the fourth operation, the nitrogen-containing gas reacts with the boron-containing solid catalyst under a normal pressure condition or low pressure condition, and a reaction time is 0.5-8 hours.

10. The method for preparing a multi-layer hexagonal boron nitride film according to claim 1, wherein after the fourth operation, cooling the substrate with the multi-layer hexagonal boron nitride film formed on the surface to room temperature.

11. The method for preparing a multi-layer hexagonal boron nitride film according to claim 10, comprising cooling the substrate with the multi-layer hexagonal boron nitride film formed on the surface to room temperature under a protecting atmosphere of nitrogen and ammonia and at a normal pressure condition, and a cooling rate is 0.25-10° C./min.

12. The method for preparing a multi-layer hexagonal boron nitride film according to claim 3, wherein the protecting gas comprises argon and hydrogen, a volume ratio of the argon to hydrogen is 1:1 to 30:1, and a pressure of the low pressure condition is 50-5000 Pa.

13. The method for preparing a multi-layer hexagonal boron nitride film according to claim 4, wherein the protecting gas comprises argon and hydrogen, a volume ratio of the argon to hydrogen is 1:1 to 30:1, and a pressure of the low pressure condition is 50-5000 Pa.

* * * * *